United States Patent
Camacho et al.

(10) Patent No.: US 7,365,417 B2
(45) Date of Patent: Apr. 29, 2008

(54) OVERHANG INTEGRATED CIRCUIT PACKAGE SYSTEM

(75) Inventors: Zigmund Ramirez Camacho, Singapore (SG); Henry D. Bathan, Singapore (SG); Arnel Trasporto, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 27 days.

(21) Appl. No.: 11/306,693

(22) Filed: Jan. 6, 2006

(65) Prior Publication Data

US 2007/0158792 A1    Jul. 12, 2007

(51) Int. Cl.
*H01L 23/02* (2006.01)
(52) U.S. Cl. ...................... 257/686; 257/666
(58) Field of Classification Search .............. 257/666, 257/686, 667, 776
See application file for complete search history.

(56) References Cited

U.S. PATENT DOCUMENTS

| 6,294,824 | B1 * | 9/2001 | Brooks et al. .............. 257/666 |
| 6,297,543 | B1 * | 10/2001 | Hong et al. ................. 257/666 |
| 6,489,668 | B1 * | 12/2002 | Oda et al. ................... 257/675 |
| 6,677,663 | B1 * | 1/2004 | Ku et al. .................... 257/666 |
| 6,894,376 | B1 * | 5/2005 | Mostafazadeh et al. ..... 257/684 |
| 6,927,479 | B2 | 8/2005 | Ramakrishna ............. 257/666 |
| 6,933,172 | B2 | 8/2005 | Tomimatsu ................ 438/109 |
| 6,959,489 | B2 | 11/2005 | Beroz et al. ................. 29/840 |
| 7,029,569 | B2 * | 4/2006 | Dowling et al. ........... 205/725 |
| 2003/0052420 | A1 * | 3/2003 | Suzuki et al. .............. 257/787 |
| 2005/0248019 | A1 | 11/2005 | Chao et al. ................ 257/686 |

* cited by examiner

*Primary Examiner*—S. V. Clark
(74) *Attorney, Agent, or Firm*—Mikio Ishimaru

(57) ABSTRACT

An integrated circuit package system is provided attaching a film to a die paddle, applying an adhesive to the film, and attaching an integrated circuit die over the adhesive and the film to the die paddle.

17 Claims, 3 Drawing Sheets

OVERHANG INTEGRATED CIRCUIT PACKAGE SYSTEM

TECHNICAL FIELD

The present invention relates generally to integrated circuit packages and more particularly to stacked integrated circuit package in packages.

BACKGROUND ART

Modern consumer electronics, such as cellular phones, digital cameras, and music players, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality. Continued integration of functions into a single integrated circuit increases the integrated circuit size necessitating a more expensive package or a higher profile package.

Thus, a need still remains for an overhang integrated circuit package system providing low cost manufacturing as well as reducing the integrated circuit package height. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides attaching a film to a die paddle, applying an adhesive to the film, and attaching an integrated circuit die over the adhesive and the film to the die paddle.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
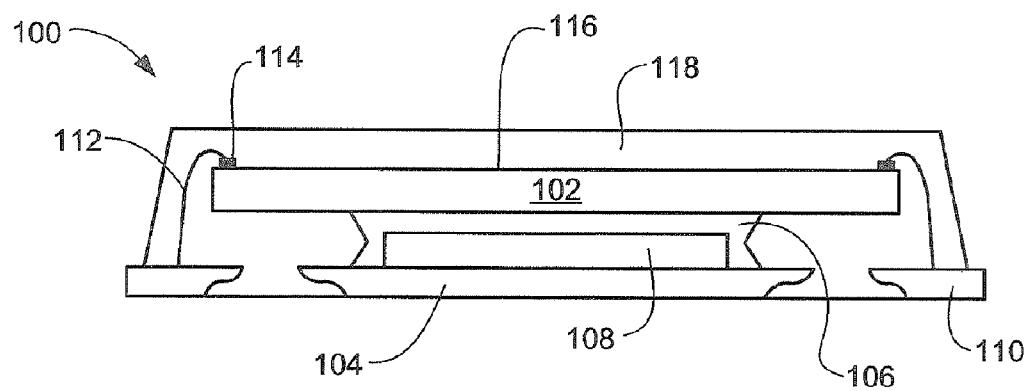
FIG. 1 is a cross-sectional view of a first overhang integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a cross-sectional view of a first overhang integrated circuit package system 100 in an embodiment of the present invention. The first overhang integrated circuit package system 100 includes an integrated circuit die 102 attached to a die paddle 104 with an adhesive 106, such as conductive epoxy or nonconductive epoxy, and a film 108. The lateral dimensions of the integrated circuit die 102 are such that the edges of the integrated circuit die 102 extend beyond the die paddle 104 overhanging lead fingers 110. Electrical interconnects 112, such as the bond wires, connect the lead fingers 110 to bonding pads 114 on an active side 116 of the integrated circuit die 102. A molding compound 118 encapsulates the integrated circuit die 102, the adhesive 106, the film 108, the top of the die paddle 104, the electrical interconnects 112, and a portion of a top of the lead fingers 110.

The film 108, such as an elastomeric monolayer film adhesive, a polyimide (PI) film, or an adhesive dual layer film, attaches to the die paddle 104. The pattern of the film 108 forms defining features that controls or directs the flow of the adhesive 106 by providing channels for the adhesive 106 or through surface tension/adhesion with the film 108. This control minimizes overflow of the adhesive 106 and contamination by the adhesive 106 from inadvertent flow. The film 108 may be a pre-cut form or a roll that needs to be cut, such as utilizing a stamp.

The film 108 and the adhesive 106 may be applied utilizing conventional die-attach manufacturing processes and equipments. The pre-cut or cut form of the film 108 may utilize pick and place method or other application methods. The adhesive 106 may be dispensed in a number of methods, such as needle time/pressure dispense. The adhesive 106, such as a die-attach epoxy, may also be applied on the film 108.

The film 108 may also elevate the integrated circuit die 102 to ensure the die paddle 104 or the lead fingers 110 do not inadvertently contact the integrated circuit die 102. The film 108 forms a predictable elevation and allows use of a less expensive adhesive without requiring adhesive particulates or different size adhesive particulates or different types of adhesives or a combination thereof. The film 108 may also eliminate manufacturing steps, such as etching or half etching the lead fingers 110 to create space for the overhang of the integrated circuit die 102, of the lead frame to form the die paddle 104 and the lead fingers 110 resulting in lower cost.

The film 108 and the adhesive 106 may provide thermal dissipation from the integrated circuit die 102 to the die paddle 104, wherein the die paddle 104 also serves as a heat sink. The adhesive 106 may not fill or partially fill the pattern of the film 108 or may be applied on top of the pattern of the film 108 providing space for other functions, such as ground connections to the integrated circuit die 102.

For illustrative purpose, the first overhang integrated circuit package system 100 depicts a singular of the integrated circuit die 102, although it is understood that the invention may be utilized for stacking a number of the integrated circuit die 102 or different integrated circuit die (not shown). Also for illustrative purpose, the electrical interconnects 112 are shown as the bond wires, although it is understood that the invention may be utilized with other electrical interconnect structures. Further for illustrative purpose, the lead fingers 110 are shown as a single row, although it is understood that the number of rows of the lead fingers 110 may not be singular.

Figure 2:
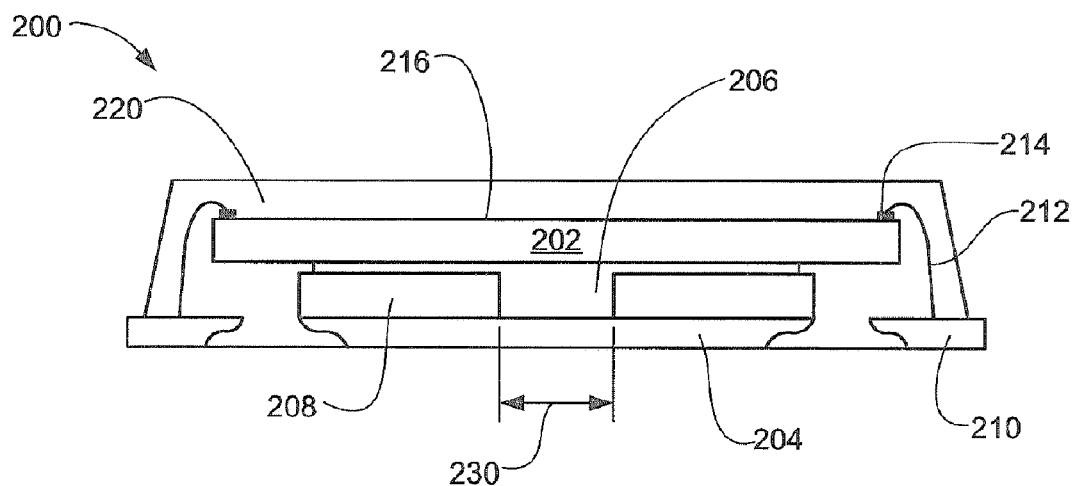
FIG. 2 is a cross-sectional view of a second overhang integrated circuit package system in an alternative embodiment of the present invention.

Referring now to FIG. 2, therein is shown a cross-sectional view of a second overhang integrated circuit package system 200 in an alternative embodiment of the present invention. The second overhang integrated circuit package system 200 includes an integrated circuit die 202 attached to a die paddle 204 with an adhesive 206, such as conductive epoxy or nonconductive epoxy and a film 208. The lateral dimensions of the integrated circuit die 202 are such that the edges of the integrated circuit die 202 extend beyond the die paddle 204 overhanging lead fingers 210. Electrical interconnects 212, such as the bond wires, connect the lead fingers 210 to bonding pads 214 on an active side 216 of the integrated circuit die 202. A molding compound 220 encapsulates the integrated circuit die 202, the adhesive 206, the film 208, the top of the die paddle 204, the electrical interconnects 212, and a portion of a top of the lead fingers 210.

The film 208, such as an elastomeric monolayer film adhesive, a polyimide (PI) film, or an adhesive dual layer film, attaches to the die paddle 204. The pattern of the film 208 forms defining features, such as channels, that controls and directs the flow of the adhesive 206. This control minimizes overflow of the adhesive 206 and contamination by the adhesive 206 from inadvertent flow. The film 208 may be a pre-cut form or a roll that needs to be cut, such as utilizing a stamp.

The adhesive 206 fills a space 230 in the pattern of the film 208 as well as covers the top of the film 208 between the film 208 and the integrated circuit die 202. The film 208 and the adhesive 206 may be applied utilizing conventional die-attach manufacturing processes and equipments. The pre-cut or cut form of the film 208 may utilize pick and place method or other application methods. The adhesive 206 may be dispensed in a number of methods, such as needle time/pressure dispense.

The film 208 may also elevate the integrated circuit die 202 to ensure the die paddle 204 or the lead fingers 210 do not inadvertently contact the integrated circuit die 202. The film 208 forms a predictable elevation and allows use of a less expensive adhesive without requiring adhesive particulates or different size adhesive particulates or different types of adhesives or a combination thereof. The film 208 may also eliminate manufacturing steps, such as etching or half etching the lead fingers 210 to create space for the overhang of the integrated circuit die 202, of the lead frame to form the die paddle 204 and the lead fingers 210 resulting in lower cost.

The film 208 and the adhesive 206 may provide thermal dissipation from the integrated circuit die 202 to the die paddle 204, wherein the die paddle 204 also serves as a heat sink. The adhesive 206 may not fill or partially fill the pattern of the film 208 or may be applied on top of the pattern of the film 208 providing space for other functions, such as ground connections to the integrated circuit die 202.

For illustrative purpose, the second overhang integrated circuit package system 200 depicts a singular of the integrated circuit die 202, although it is understood that the invention may be utilized for stacking a number of the integrated circuit die 202 or different integrated circuit die (not shown). Also for illustrative purpose, the electrical interconnects 212 are shown as the bond wires, although it is understood that the invention may be utilized with other electrical interconnect structures. Further for illustrative purpose, the lead fingers 210 are shown as a single row, although it is understood that the number of rows of the lead fingers 210 may not be singular.

Figure 3:
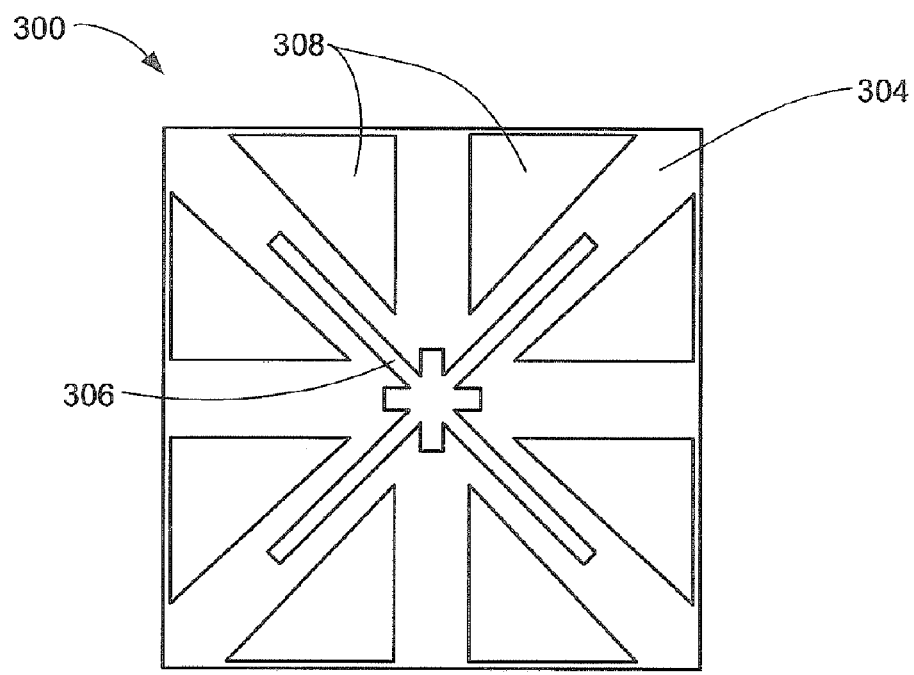
FIG. 3 is a plan view of a channeled film pattern.

Referring now to FIG. 3, therein is shown a plan view of a channeled film pattern 300. A film 308 may be cut with channels within the film 308, picked, and placed on a die paddle 304. The channeled film pattern 300 includes channels in the film 308 in a geometric configuration, such as an asterisk with intersecting angled, vertical and horizontal lines. An adhesive 306 is applied within the channels and the film 308 is in a geometric configuration, such as a triangle.

The channels as well as the adhesive 306 in the channels may provide thermal dissipation path from an integrated circuit die (not shown) to the die paddle 304. The channels may provide space for a heat sink or additional ground connections between the die paddle 304 and the integrated circuit die.

Figure 4:
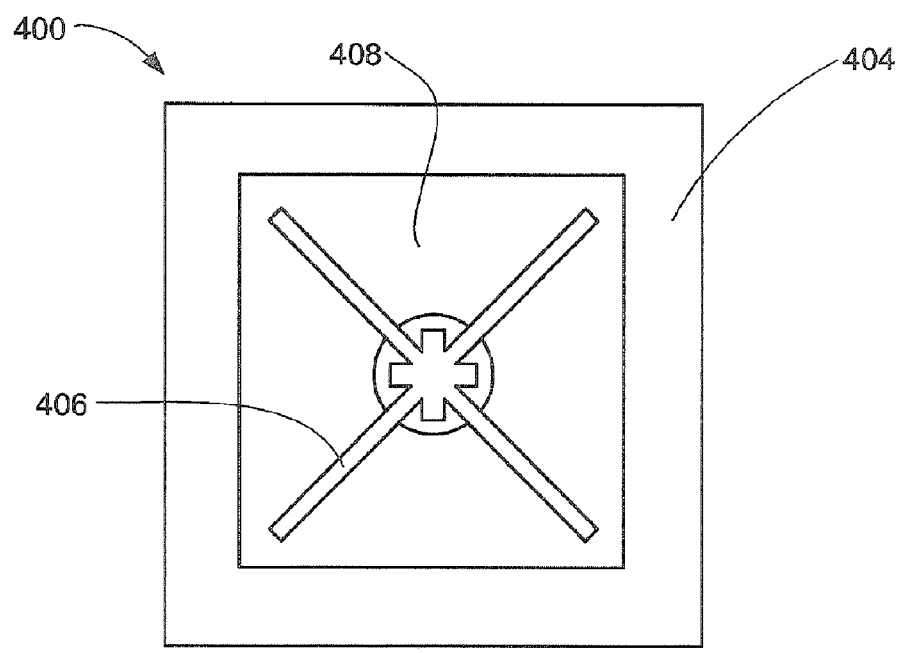
FIG. 4 is a plan view of an inner space film pattern.

Referring now to FIG. 4, therein is shown a plan view of an inner space film pattern 400. A film 408 may be cut with a space in the interior of the film 408, picked, and placed on a die paddle 404. The inner space film pattern 400 includes the interior space in the film 408 in a geometric configuration, such as a circle. An adhesive 406 is applied within the interior space and on top of the film 408. The film 408 is in a geometric configuration, such as a square, where the edges of the film 408 to do not extend to the edges of the die paddle 404, for example, controlling the bleeding of the adhesive 406 along the edges to prevent contamination by the adhesive 406.

The interior space as well as the adhesive 406 may provide thermal dissipation path from an integrated circuit die (not shown) to the die paddle 404. The interior space may provide space for a heat sink or additional ground connections between the die paddle 404 and the integrated circuit die.

The film 408 and the adhesive 406 may be used to stack integrated circuit die. The film 408 may extend not to the edges of the integrated circuits in a stacked configuration allowing for electrical connections (not shown) to the bonding pads (not shown) at the edges of the integrated circuit die.

Figure 5:
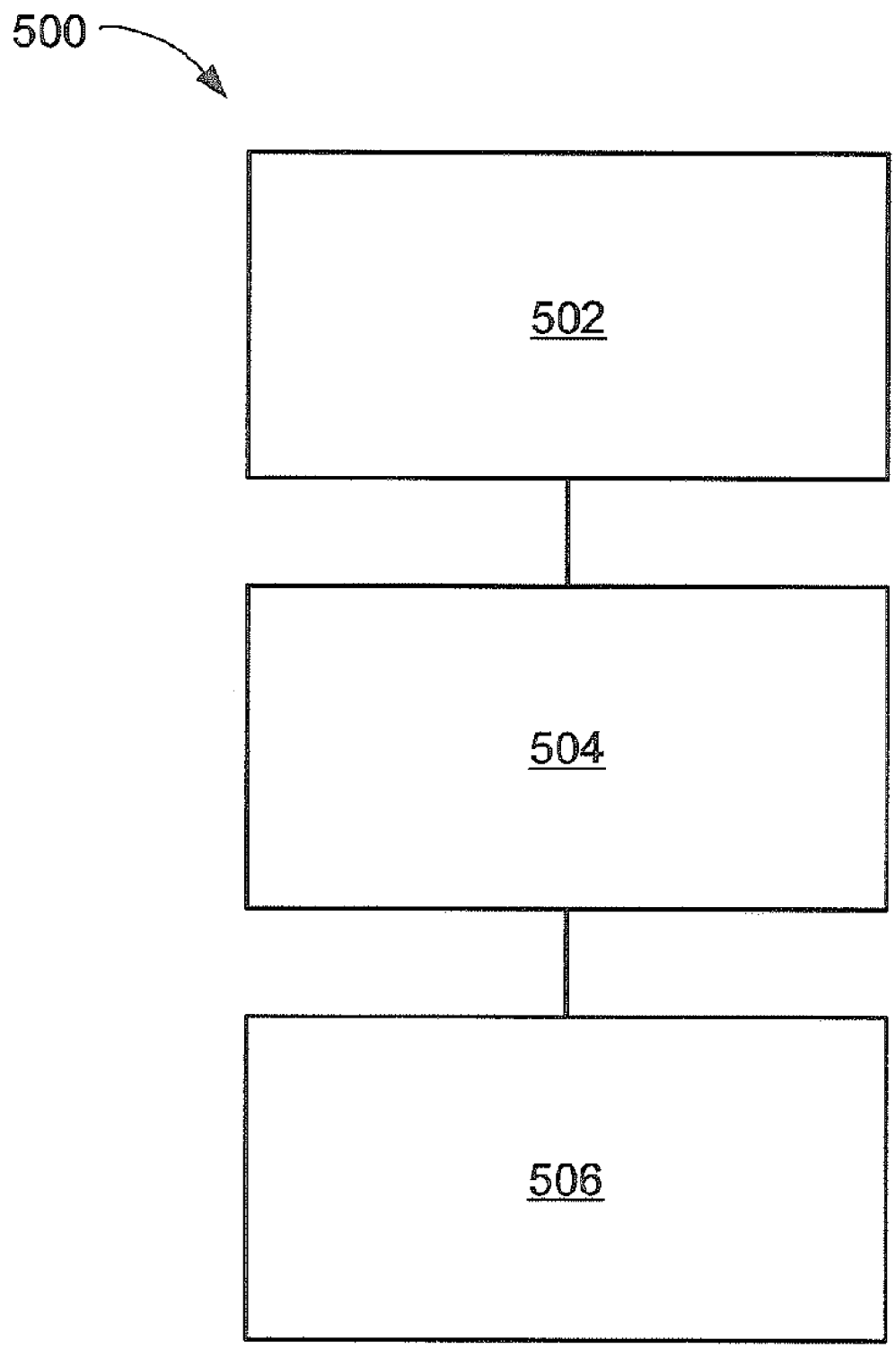
FIG. 5 is a flow chart of an overhang integrated circuit package system for an overhang integrated circuit package in an embodiment of the present invention.

Referring now to FIG. 5, therein is shown a flow chart of an integrated circuit package system 500 for an overhang integrated circuit package system 100 in an embodiment of the present invention. The system 500 includes attaching a film to a die paddle in a block 502; applying an adhesive to the film in a block 504; and attaching an integrated circuit die over the adhesive and the film to the die paddle in a block 506.

It has been discovered that the present invention thus has numerous aspects.

It has been discovered that the film used in conjunction with an adhesive has numerous benefits, such as improved manufacturing controls, cost reduction, improved yields, and reduction in steps during the integrated circuit package manufacturing processes.

An aspect is that the present invention is the film defines features to help direct the flow of the adhesive resulting in better flow control. The film as cut or pre-cut in certain patterns or configurations may provide channels for adhesive flow or for adhesive bleeding.

Another aspect of the present invention is that the film elevates the integrated circuit die such that the edges of the integrated circuit die overhangs above the lead fingers. This eliminates or reduces the steps of the lead frame package manufacturing by eliminating the etch or half etch of the inner portion of the lead fingers to create space for the large integrated circuit die.

Yet another aspect of the present invention is that the film pattern may provide channels or interior space in the film that may used as thermal dissipation path from the integrated circuit die to the die paddle. Additional ground connections may be formed between the integrated circuit die and the die paddle within the channels or interior space of the film.

Yet another aspect of the present invention is that the film and the adhesive are materials that are commonly available and may be applied using conventional methods.

Thus, it has been discovered that the integrated circuit package in package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit package in packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. An integrated circuit package system comprising:
    attaching a film, having a pattern with an adhesive flow controlling feature, to a die paddle;
    applying an adhesive to the film along the flow controlling feature; said film minimizes overflow of the adhesive, and
    attaching an integrated circuit die over the adhesive and the film to the die paddle; and
    forming a lead frame package includes the die paddle and lead fingers with the edges of the integrated circuit die elevated and overhanging the lead fingers.

2. The system as claimed in claim 1 further comprising forming a lead frame package with a configuration comprised of single row of lead fingers or multiple rows of the lead fingers.

3. The system as claimed in claim 1 wherein attaching the film to the die paddle comprises forming patterns of the film comprised of segments of the film with channels or an interior space within the film or a combination thereof.

4. The system as claimed in claim 1 wherein attaching the film comprises providing a space at edges of a surface with the film attached thereon.

5. A integrated circuit package system comprising:
    forming a film with a pattern having an adhesive flow controlling feature;
    attaching the film to a die paddle of a lead frame;
    applying an adhesive to the pattern of the film along the flow controlling feature; said film minimizes overflow of the adhesive, and
    attaching an integrated circuit die with the adhesive and the film to the die paddle comprising:
    forming lead fingers of the lead frame; and
    elevating an overhang of the integrated circuit die over the lead fingers with the film.

6. The system as claimed in claim 5 wherein attaching the film to the die paddle of the lead frame comprises forming a thermal dissipation path from the integrated circuit die to the die paddle with the adhesive within the film.

7. The system as claimed in claim 5 wherein attaching the film to the die paddle of the lead frame comprises forming ground connections between the die paddle and the integrated circuit within the film.

8. The system as claimed in claim 5 wherein applying the adhesive is comprised of a conductive material or nonconductive material.

9. An integrated circuit package system comprising:
    a film, having a pattern with an adhesive flow controlling feature, attached to a die paddle;
    an adhesive applied to the film along the flow controlling feature;
    an integrated circuit die over the adhesive and the film to the die paddle; said film minimizes overflow of the adhesive, and
    a lead frame package including the die paddle and lead fingers with the edges of the integrated circuit die elevated and overhanging the lead fingers.

10. The system as claimed in claim 9 further comprising a lead frame package with a configuration comprised of single row of lead fingers or two rows of the lead fingers.

11. The system as claimed in claim 9 wherein the film attached to the die paddle comprises patterns of the film comprised of segments of the film with channels or an interior space within the film or a combination thereof.

12. The system as claimed in claim 9 wherein the film comprises a space at edges of a surface with the film attached thereon.

13. The system as claimed in claim 9 wherein:
the film attached to the die paddle is cut to form,
the adhesive applied to the film is an epoxy, and
the integrated circuit die over the adhesive and the film to the die paddle has lateral dimensions larger than the die paddle;
further comprising:
the film is cut to form a pattern; and
the die paddle formed from a lead frame.

14. The system as claimed in claim 13 wherein the integrated circuit die with the adhesive and the film to the die paddle comprises:
lead fingers of the lead frame; and
an overhang of the integrated circuit die over the lead fingers with the film.

15. The system as claimed in claim 13 wherein the film attached to the die paddle of the lead frame is a thermal dissipation path from the integrated circuit die to the die paddle with the adhesive within the film.

16. The system as claimed in claim 13 wherein the film attached to the die paddle of the lead frame is ground connections between the die paddle and the integrated circuit die within the film.

17. The system as claimed in claim 13 wherein the adhesive is a conductive material or nonconductive material.

* * * * *